(12) United States Patent
Marquardt et al.

(10) Patent No.: US 10,890,313 B2
(45) Date of Patent: *Jan. 12, 2021

(54) OPTIC FOR A LIGHT SOURCE

(71) Applicant: ABL IP Holding LLC, Atlanta, GA (US)

(72) Inventors: Craig Eugene Marquardt, Covington, GA (US); Jie Chen, Snellville, GA (US); Daniel Aaron Weiss, Atlanta, GA (US)

(73) Assignee: ABL IP Holding LLC, Atlanta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/800,405

(22) Filed: Feb. 25, 2020

(65) Prior Publication Data
US 2020/0191357 A1      Jun. 18, 2020

Related U.S. Application Data

(63) Continuation of application No. 15/266,738, filed on Sep. 15, 2016, now Pat. No. 10,578,276, which is a
(Continued)

(51) Int. Cl.
*F21V 21/00* (2006.01)
*F21V 5/04* (2006.01)
(Continued)

(52) U.S. Cl.
CPC .......... *F21V 5/04* (2013.01); *B29D 11/00807* (2013.01); *F21V 5/007* (2013.01);
(Continued)

(58) Field of Classification Search
CPC ..... F21V 5/04; F21V 7/28; F21V 7/24; F21V 5/007; F21V 5/008; F21V 5/048;
(Continued)

(56) References Cited

U.S. PATENT DOCUMENTS

| 4,935,665 A | 6/1990 | Murata |
| 5,903,212 A | 5/1999 | Rodgers |

(Continued)

FOREIGN PATENT DOCUMENTS

| EP | 2484956 | 8/2012 |
| EP | 2779807 | 6/2017 |

(Continued)

OTHER PUBLICATIONS

U.S. Appl. No. 13/834,599, Amendment and Response to Non-Final Office Action dated Mar. 2, 2016, 8 pages.
(Continued)

*Primary Examiner* — Laura K Tso
(74) *Attorney, Agent, or Firm* — Kilpatrick Townsend & Stockton LLP

(57) ABSTRACT

Optics over a light source, such as, but not limited to, an LED on a circuit board. The optic does not entirely encapsulate the LED but rather includes an inner surface such that an air gap exists between the optic and the LED. The optic may include a lens and may conform to the shape of the circuit board.

20 Claims, 6 Drawing Sheets

Related U.S. Application Data continuation of application No. 13/834,599, filed on Mar. 15, 2013, now Pat. No. 9,470,395.

(51) Int. Cl.

| | |
|---|---|
| *H05K 3/28* | (2006.01) |
| *F21V 5/00* | (2018.01) |
| *F21V 23/00* | (2015.01) |
| *H05K 1/02* | (2006.01) |
| *F21V 7/24* | (2018.01) |
| *F21V 7/28* | (2018.01) |
| *F21V 7/22* | (2018.01) |
| *F21V 13/04* | (2006.01) |
| *B29D 11/00* | (2006.01) |
| *F21V 19/00* | (2006.01) |
| *H05K 1/18* | (2006.01) |
| *F21Y 101/00* | (2016.01) |
| *F21Y 115/10* | (2016.01) |
| *B29K 83/00* | (2006.01) |
| *B29K 105/00* | (2006.01) |

(52) U.S. Cl.
CPC ............. *F21V 5/008* (2013.01); *F21V 5/048* (2013.01); *F21V 7/22* (2013.01); *F21V 7/24* (2018.02); *F21V 7/28* (2018.02); *F21V 13/04* (2013.01); *F21V 19/002* (2013.01); *F21V 23/005* (2013.01); *H05K 1/0274* (2013.01); *H05K 1/181* (2013.01); *H05K 3/284* (2013.01); *B29K 2083/00* (2013.01); *B29K 2105/253* (2013.01); *F21Y 2101/00* (2013.01); *F21Y 2115/10* (2016.08); *H05K 2201/0162* (2013.01); *H05K 2201/10106* (2013.01); *H05K 2203/1327* (2013.01); *Y10T 29/49124* (2015.01)

(58) Field of Classification Search
CPC .......... F21V 7/22; F21V 13/04; F21V 19/002; F21V 23/005; H05K 1/0274; H05K 2201/10106; F29K 2115/10; F29K 2101/00
USPC .................................................... 362/311.02
See application file for complete search history.

(56) References Cited

U.S. PATENT DOCUMENTS

| | | | |
|---|---|---|---|
| 5,958,176 A | 9/1999 | Isshiki et al. | |
| 6,040,395 A | 3/2000 | Isshiki et al. | |
| 6,179,436 B1 | 1/2001 | Gitkind | |
| 6,188,527 B1 | 2/2001 | Bohn | |
| 6,235,862 B1 | 5/2001 | Isshiki et al. | |
| 6,518,204 B2 | 2/2003 | Yamakawa et al. | |
| 6,997,575 B2 | 2/2006 | Sommers | |
| 7,040,779 B2 | 5/2006 | Lamke et al. | |
| 7,259,403 B2 | 8/2007 | Shimizu et al. | |
| 7,273,300 B2 | 9/2007 | Mrakovich | |
| 7,344,902 B2 | 3/2008 | Basin et al. | |
| 7,352,011 B2 | 4/2008 | Smits et al. | |
| 7,355,284 B2 | 4/2008 | Negley | |
| 7,400,439 B2 | 7/2008 | Holman | |
| 7,452,737 B2 | 11/2008 | Basin et al. | |
| 7,496,270 B2 | 2/2009 | Kim et al. | |
| 7,625,986 B2 | 12/2009 | Yoshitake et al. | |
| 7,651,887 B2 | 1/2010 | Morita et al. | |
| 7,651,958 B2 | 1/2010 | Morita et al. | |
| 7,709,853 B2 | 5/2010 | Medendorp, Jr. | |
| 7,748,872 B2 | 7/2010 | Holder et al. | |
| 7,763,478 B2 | 7/2010 | Loh et al. | |
| 7,763,697 B2 | 7/2010 | Kato et al. | |
| 7,828,453 B2 | 11/2010 | Tran et al. | |
| 7,850,341 B2 | 12/2010 | Mrakovich et al. | |
| 7,857,497 B2 | 12/2010 | Koike et al. | |
| 7,858,408 B2 | 12/2010 | Mueller et al. | |
| 7,858,998 B2 | 12/2010 | Negley | |
| 7,863,392 B2 | 1/2011 | Nakanishi et al. | |
| 7,918,590 B1 | 4/2011 | Li et al. | |
| 7,990,033 B2 | 8/2011 | Nakata et al. | |
| 8,002,435 B2 | 8/2011 | Laporte | |
| 8,070,329 B1 | 12/2011 | Bechtel et al. | |
| 8,071,697 B2 | 12/2011 | Frisch et al. | |
| 8,147,742 B2 | 4/2012 | Chen et al. | |
| 8,163,580 B2 | 4/2012 | Daschner et al. | |
| 8,217,412 B2 | 7/2012 | Yuan et al. | |
| 8,258,502 B2 | 9/2012 | Yoshitake et al. | |
| 8,262,970 B2 | 9/2012 | Morita et al. | |
| 8,267,553 B2 | 9/2012 | Liang et al. | |
| 8,269,240 B2 | 9/2012 | Negley | |
| 8,287,150 B2 | 10/2012 | Schaefer et al. | |
| 8,293,548 B2 | 10/2012 | Cheng et al. | |
| 8,963,188 B2 | 2/2015 | Park | |
| 9,470,395 B2* | 10/2016 | Marquardt | F21V 19/002 |
| 10,578,276 B2 | 3/2020 | Marquardt et al. | |
| 10,636,950 B2* | 4/2020 | Pickard | H01L 33/58 |
| 2005/0052737 A1 | 3/2005 | Amemiya et al. | |
| 2005/0259424 A1 | 11/2005 | Zampini, II et al. | |
| 2006/0097385 A1 | 5/2006 | Negley | |
| 2006/0105485 A1 | 5/2006 | Basin et al. | |
| 2007/0012940 A1 | 1/2007 | Suh et al. | |
| 2007/0029569 A1 | 2/2007 | Andrews | |
| 2007/0121326 A1 | 5/2007 | Nall et al. | |
| 2007/0269747 A1 | 11/2007 | Bahadur et al. | |
| 2008/0033843 A1 | 2/2008 | Warton et al. | |
| 2008/0157114 A1 | 7/2008 | Basin et al. | |
| 2008/0170396 A1 | 7/2008 | Yuan et al. | |
| 2008/0174997 A1 | 7/2008 | Zampini et al. | |
| 2008/0185601 A1 | 8/2008 | Frisch et al. | |
| 2008/0193749 A1 | 8/2008 | Thompson et al. | |
| 2008/0273327 A1 | 11/2008 | Wilcox et al. | |
| 2009/0050907 A1 | 2/2009 | Yuan et al. | |
| 2009/0146175 A1 | 6/2009 | Bahadur et al. | |
| 2009/0225543 A1 | 9/2009 | Jacobson et al. | |
| 2009/0323330 A1 | 12/2009 | Gordin et al. | |
| 2010/0060157 A1 | 3/2010 | Shi | |
| 2010/0065983 A1 | 3/2010 | Kawakubo | |
| 2010/0128474 A1 | 5/2010 | Chen et al. | |
| 2010/0195326 A1 | 8/2010 | Boxler et al. | |
| 2010/0232133 A1 | 9/2010 | Tran et al. | |
| 2011/0007513 A1 | 1/2011 | Zhang et al. | |
| 2011/0031516 A1 | 2/2011 | Basin et al. | |
| 2011/0057205 A1 | 3/2011 | Mueller et al. | |
| 2011/0068356 A1 | 3/2011 | Chiang et al. | |
| 2011/0103051 A1 | 5/2011 | Wilcox et al. | |
| 2011/0157891 A1 | 6/2011 | Davis et al. | |
| 2011/0194281 A1 | 8/2011 | Josefowicz et al. | |
| 2011/0216538 A1 | 9/2011 | Logan et al. | |
| 2011/0227235 A1 | 9/2011 | Yoshitake et al. | |
| 2011/0242807 A1 | 10/2011 | Little, Jr. et al. | |
| 2011/0254047 A1 | 10/2011 | Yoshitake et al. | |
| 2011/0272722 A1 | 11/2011 | Chen | |
| 2011/0280014 A1 | 11/2011 | Householder et al. | |
| 2011/0320998 A1 | 12/2011 | Perry et al. | |
| 2012/0001208 A1 | 1/2012 | Brick et al. | |
| 2012/0061716 A1 | 3/2012 | Yu et al. | |
| 2012/0065343 A1 | 3/2012 | Bahadur et al. | |
| 2012/0074450 A1 | 3/2012 | Sakurai et al. | |
| 2012/0106166 A1* | 5/2012 | Chang | F21V 5/08 362/311.02 |
| 2012/0120654 A1 | 5/2012 | Kobayashi et al. | |
| 2012/0125436 A1 | 5/2012 | Cummings et al. | |
| 2012/0165451 A1 | 6/2012 | Igarashi et al. | |
| 2012/0182739 A1 | 7/2012 | Leung et al. | |
| 2012/0199995 A1 | 8/2012 | Pugh et al. | |
| 2012/0235180 A1 | 9/2012 | Medendorp, Jr. | |
| 2012/0250309 A1 | 10/2012 | Handsaker | |
| 2012/0267650 A1 | 10/2012 | Schubert et al. | |
| 2013/0134609 A1 | 5/2013 | Yoshitake et al. | |
| 2014/0268810 A1 | 9/2014 | Marquardt et al. | |

(56) References Cited

U.S. PATENT DOCUMENTS

| | | | |
|---|---|---|---|
| 2014/0293614 A1* | 10/2014 | Wang He | G02B 19/0061 362/311.02 |
| 2015/0184826 A1* | 7/2015 | Hu | G02B 19/0028 362/97.1 |
| 2017/0002998 A1 | 1/2017 | Marquardt et al. | |

FOREIGN PATENT DOCUMENTS

| | | |
|---|---|---|
| JP | 2010110894 | 5/2010 |
| JP | 2011138831 | 7/2011 |
| WO | 2004068596 | 8/2004 |

OTHER PUBLICATIONS

U.S. Appl. No. 13/834,599, Final Office Action dated Jul. 10, 2015, 16 pages.
U.S. Appl. No. 13/834,599, Non-Final Office Action dated Dec. 3, 2015, 11 pages.
U.S. Appl. No. 13/834,599, Non-Final Office Action dated Dec. 18, 2014, 14 pages.
U.S. Appl. No. 13/834,599, Amendment dated Mar. 18, 2015, 16 pages.
U.S. Appl. No. 13/834,599, Notice of Allowance dated Jun. 15, 2016, 8 pages.
U.S. Appl. No. 14/598,797, Extended European Search Report dated Jul. 10, 2014, 6 pages.
U.S. Appl. No. 15/266,738, Final Office Action dated Jan. 23, 2019, 10 pages.
U.S. Appl. No. 15/266,738, Non-Final Office Action dated Jun. 12, 2018, 9 pages.
U.S. Appl. No. 15/266,738, Notice of Allowance dated Oct. 21, 2019, 10 pages.

* cited by examiner

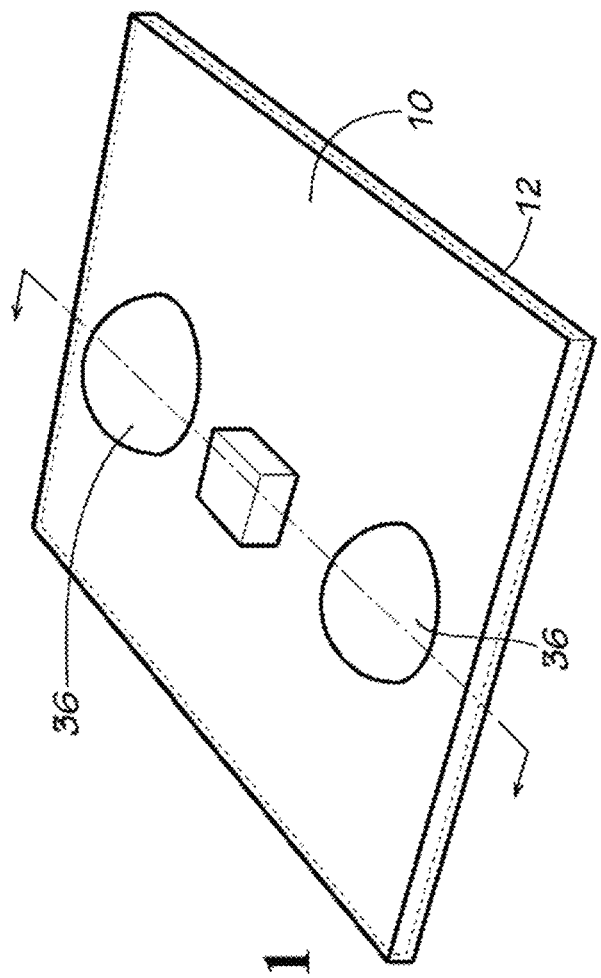
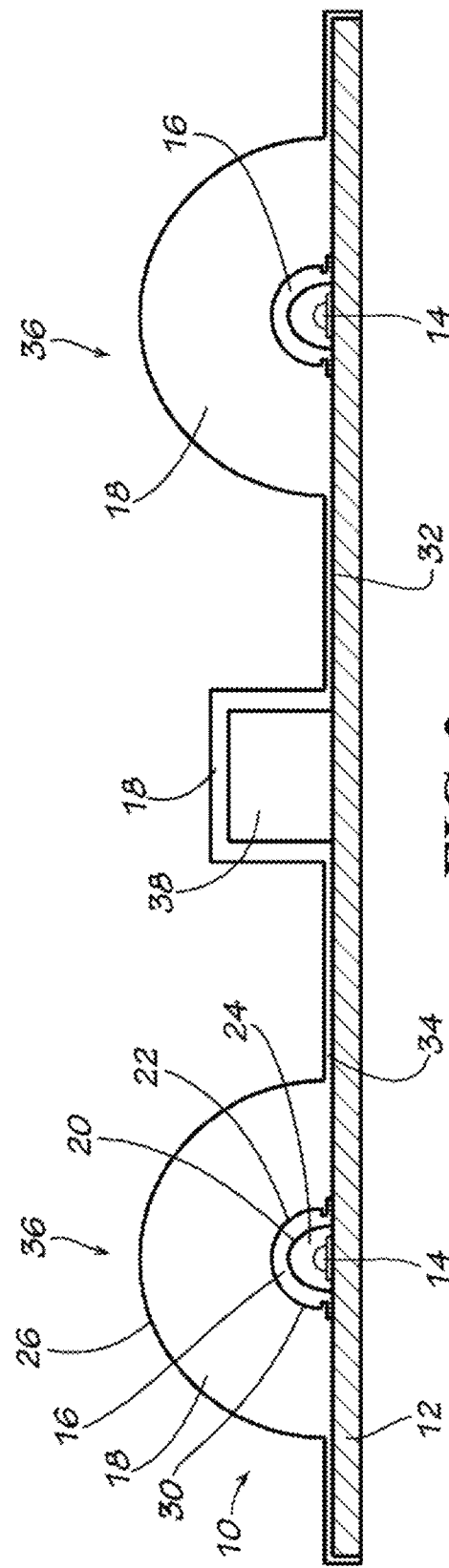
FIG. 1
FIG. 2

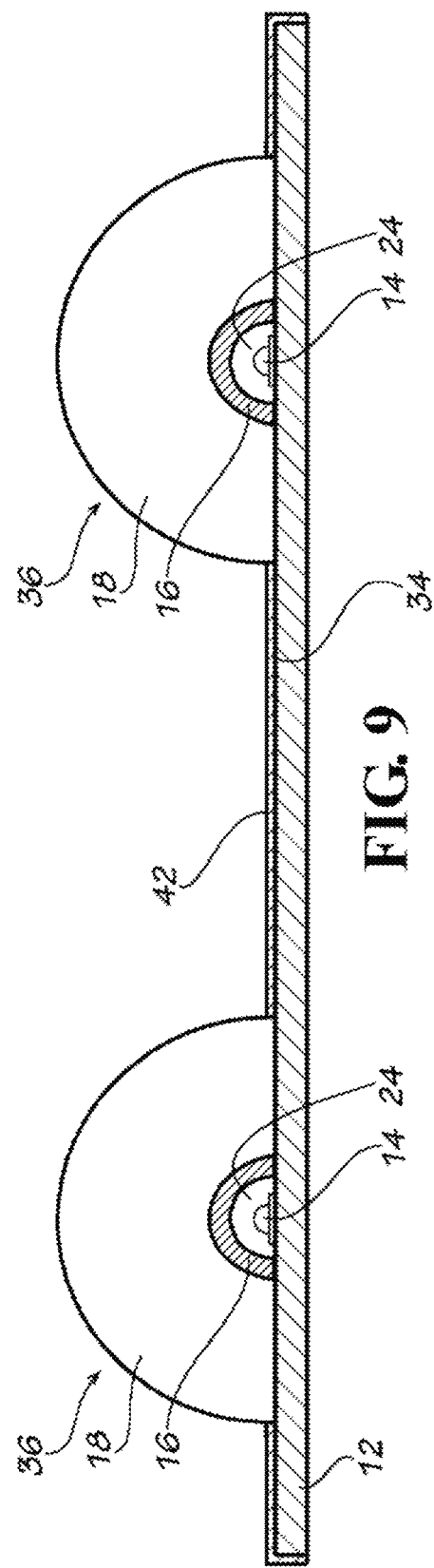
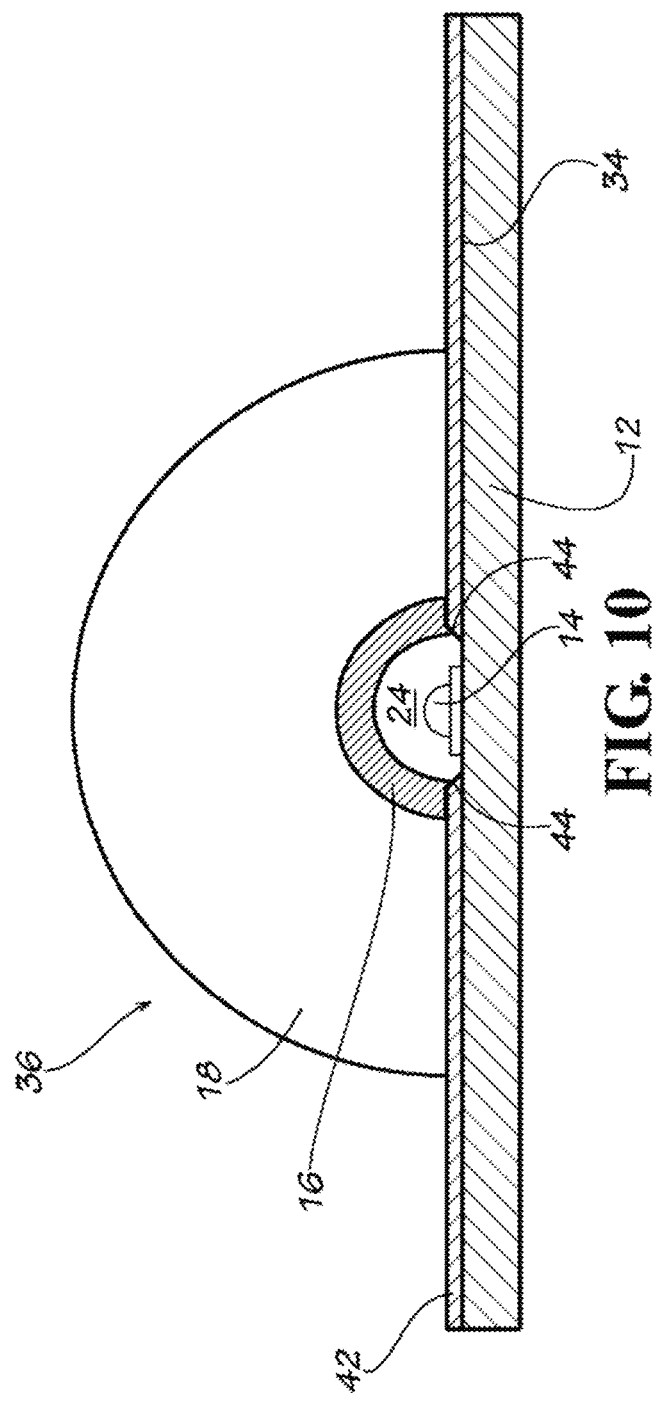

OPTIC FOR A LIGHT SOURCE

CROSS REFERENCE TO RELATED APPLICATION

This application is a continuation of U.S. patent application Ser. No. 15/266,738, allowed, which is a continuation of U.S. patent application Ser. No. 13/834,599, issued as U.S. Pat. No. 9,470,395, both of which are incorporated herein by reference in their entirety.

FIELD

Embodiments of the present invention relate to an optic for a light source, such as a light emitting diode.

BACKGROUND

Light emitting diodes ("LEDs") are typically mounted on a printed circuit board ("PCB") and wired to the PCB. Often a silicone or acrylic optic is deposited over the LED to encapsulate the LED such that no space exists between the optic and the LED. Encapsulation of the LED by the optic eliminates a surface that could otherwise be used to control the light distribution.

SUMMARY

Certain embodiments of the present invention provide an optic over a light source, such as, but not limited to, an LED, whereby the optic does not entirely encapsulate the LED but rather includes an inner surface such that an air gap exists between the optic and the LED.

The terms "invention," "the invention," "this invention" and "the present invention" used in this patent are intended to refer broadly to all of the subject matter of this patent and the patent claims below. Statements containing these terms should not be understood to limit the subject matter described herein or to limit the meaning or scope of the patent claims below. Embodiments of the invention covered by this patent are defined by the claims below, not this summary. This summary is a high-level overview of various aspects of the invention and introduces some of the concepts that are further described in the Detailed Description section below. This summary is not intended to identify key or essential features of the claimed subject matter, nor is it intended to be used in isolation to determine the scope of the claimed subject matter. The subject matter should be understood by reference to the entire specification of this patent, all drawings and each claim.

BRIEF DESCRIPTION OF THE FIGURES

Illustrative embodiments of the present invention are described in detail below with reference to the following drawing figures:

FIG. 1 is a top perspective view of an embodiment of an optic positioned on a PCB.

FIG. 2 is a cross-sectional view taken along line 2-2 in FIG. 1.

FIG. 9 is a cross-sectional view of yet another embodiment of an optic as well as a reflective surface coating positioned on a PCB.

FIG. 10 is an isolated cross-sectional view of another embodiment of an optic as well as a reflective surface coating positioned on a PCB.

DETAILED DESCRIPTION

The subject matter of embodiments of the present invention is described here with specificity to meet statutory requirements, but this description is not necessarily intended to limit the scope of the claims. The claimed subject matter may be embodied in other ways, may include different elements or steps, and may be used in conjunction with other existing or future technologies. This description should not be interpreted as implying any particular order or arrangement among or between various steps or elements except when the order of individual steps or arrangement of elements is explicitly described.

Embodiments of the present invention provide an optic over a light source, such as, but not limited to, an LED, whereby the optic does not entirely encapsulate the LED but rather includes an inner surface such that an air gap exists between the optic and the LED. FIGS. 1 and 2 illustrate an embodiment of an optic 10 contemplated herein provided on a PCB 12 populated with LEDs 14. The PCB 12 can be of any shape or size and any number of LEDs 14 may be mounted on the PCB 12 in any orientation.

Figure 3:
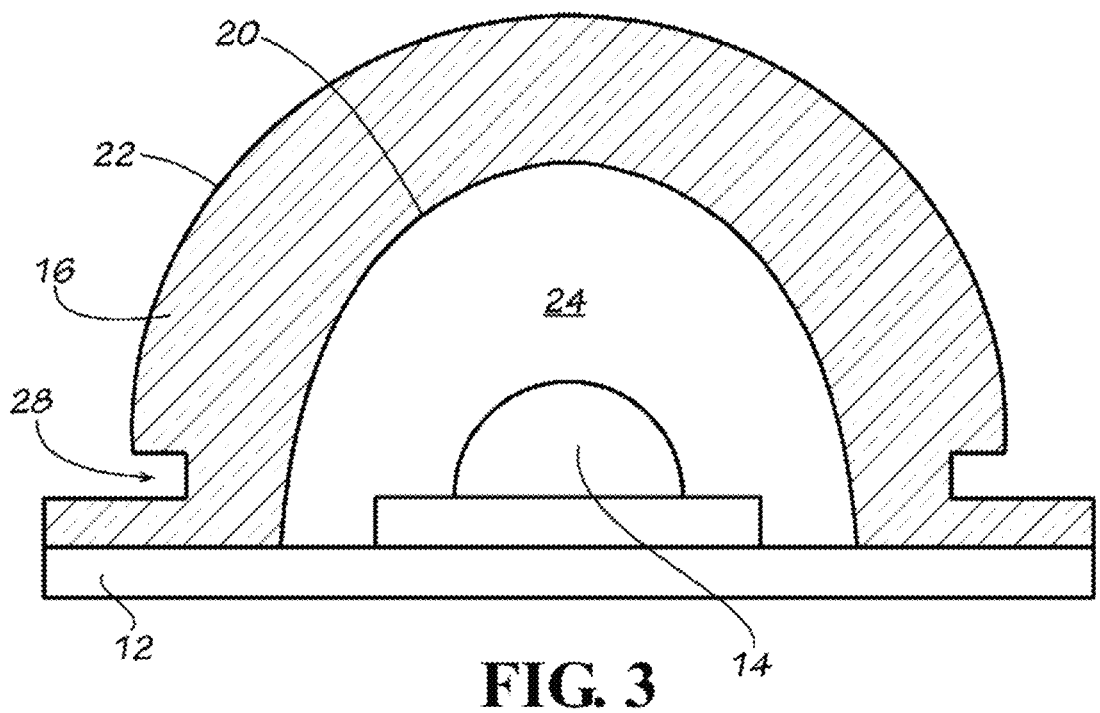
FIG. 3 is an isolated cross-sectional view of an embodiment of an inner optic positioned over an LED.

The optic 10 includes an inner optic 16 and an outer optic 18. In some embodiments, the inner optic 16 is pre-formed and includes an inner surface 20 and an outer surface 22. The inner surface 20 and outer surface 22 may be formed in any shape and with any surface enhancements to have the desired optical properties to effectuate the desired bending of the light emitted by the LED 14. The inner optic 16 is glued or bonded over the LED 14, such as with silicone or other optical adhesives. See FIG. 3. This seals the LED 14 within the inner optic 16. When so positioned, an air gap 24 exists between the LED 14 and the inner surface 20 of the inner optic 16.

The outer optic 18 is then molded directly over the inner optic 16 so as to have an outer surface 26. In some embodiments, an interlocking feature (such as key 28) may be, but does not have to be, provided on the inner optic 16 to enhance retention of the outer optic 18 on the inner optic 16. Provision of the outer optic 18 over the inner optic 16 serves to protect the outer surface of the inner optic 16 from dirt and debris.

The outer surface 26 of the outer optic 18 may be of any shape and with any surface enhancements to have the desired optical properties to effectuate the desired distribution of the light emitted by the LED 14.

Figure 4:
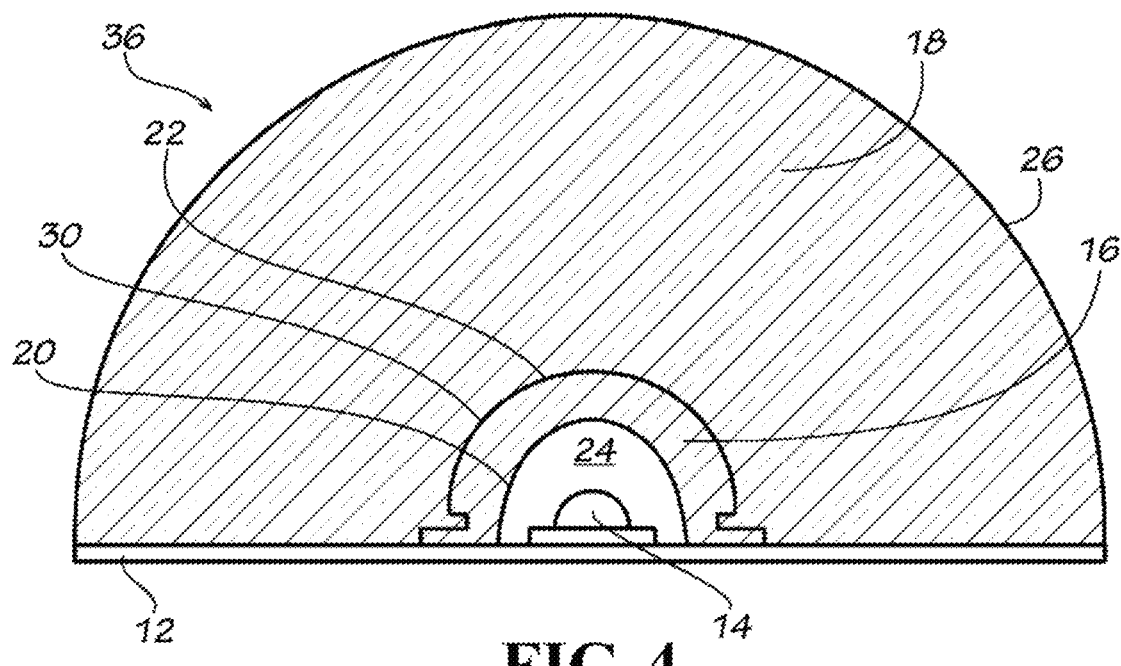
FIG. 4 is an isolated cross-sectional view of an embodiment of an outer optic positioned over the inner optic of FIG. 3.

In some embodiments (see FIG. 4), the inner optic 16 and outer optic 18 are formed of the identical material (including, but not limited to, silicone) such that the witness line 30 where the outer optic 18 encounters the outer surface 22 of the inner optic 16 is undetectable (although it is shown in FIG. 4 for purposes of illustration).

Figure 5:
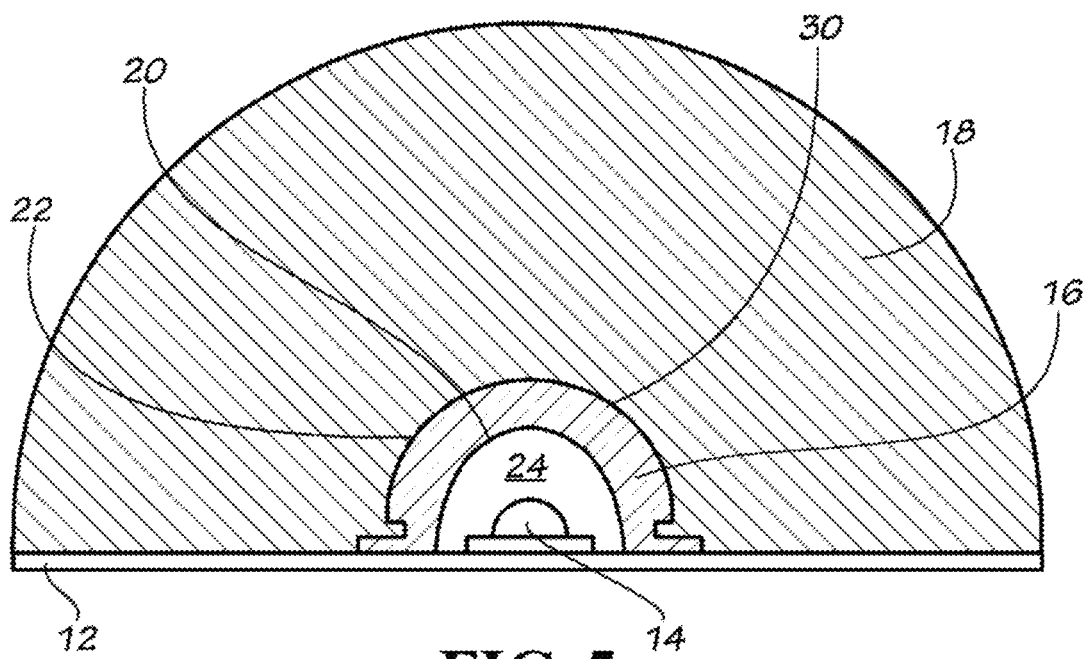
FIG. 5 is an isolated cross-sectional view of another embodiment of an outer optic positioned over the inner optic of FIG. 3.

However, in other embodiments (see FIG. 5), the materials used to form the inner optic 16 and outer optic 18 are not identical. By way only of example, the inner optic 16 could be formed of a silicone material different from the silicone material forming the outer optic 18. In such circumstances, the witness line 30 where the inner optic 16 and outer optic 18 meet is detectable and serves further to bend the emitted light. In such embodiments, the shape and optical properties of the outer surface 22 of the inner optic 16 impacts the light distribution. Moreover, in such embodiments, the inner optic 16 can bend or direct the emitted light at different angles than the outer optic 18.

Figure 6:
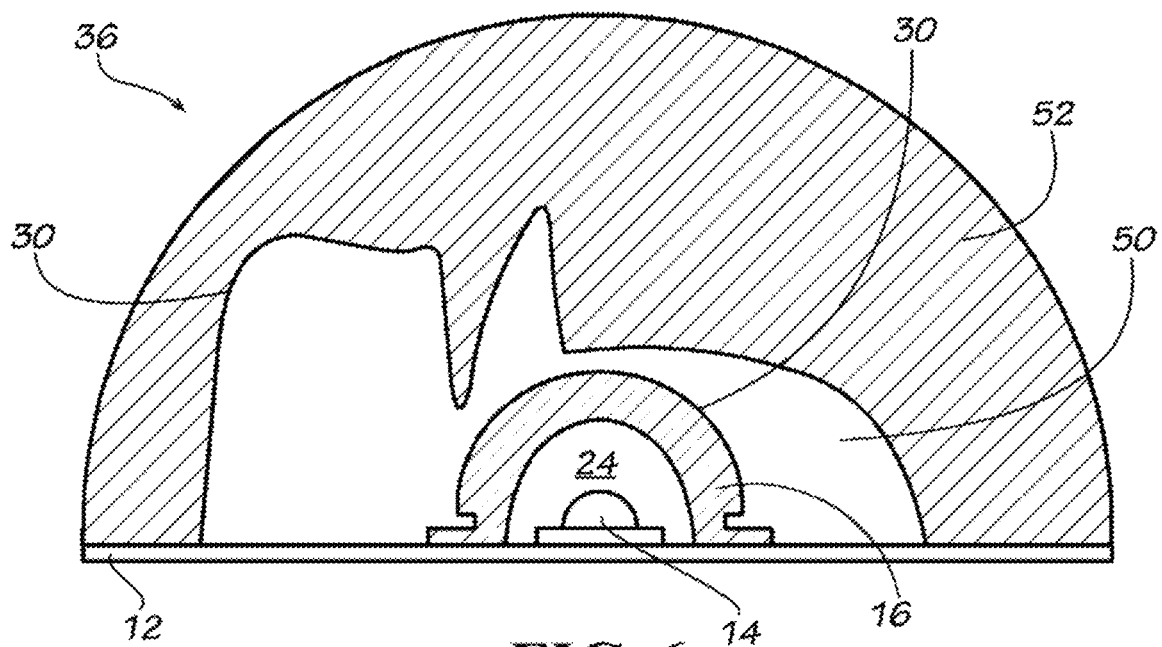
FIG. 6 is an isolated cross-sectional view of yet another embodiment of an outer optic positioned over the inner optic of FIG. 3.

It is possible to mold multiple outer optics 18 over the inner optic 16. For example, FIG. 6 illustrates a first outer optic 50 and a second outer optic 52 provided over inner optic 16. In some embodiments, the first outer optic 50 is formed of a material that is different from both the inner optic 16 and the second outer optic 52 so that multiple witness lines 30 (having any desired shape) are formed within the optic 10 for directing the emitted light as desired.

In some embodiments, the outer optic 18 is also molded directly onto the upper surface 34 of the PCB 12 such that the lower surface 32 of the optic 10 contacts the upper surface 34 of the PCB 12 but includes lenses 36 (the underside of which is defined by the inner surface 20 of the inner optic 16) positioned over the LEDs 14. See FIG. 2. The upper surface 34 of the PCB 12 between adjacent LEDs 14 is typically populated with electronic components (e.g., traces, resistors, etc.), represented schematically as electronic components 38, such that the upper surface 34 of the PCB 12 is not planar. The outer optic 18 may be molded directly onto the upper surface 34 of the PCB 12 and over such electronic components 38 so as to seal and protect the electronic components 38 on the PCB 12. In this way, the lower surface 32 of the optic 10 (more specifically the outer optic 18) conforms to the shape of such electronic components 38 on the PCB 12. Because the silicone cure temperature is lower than the solder paste and electronic equipment on the PCB 12, the disclosed molding process does no damage to such electronic components 38.

Figure 7:
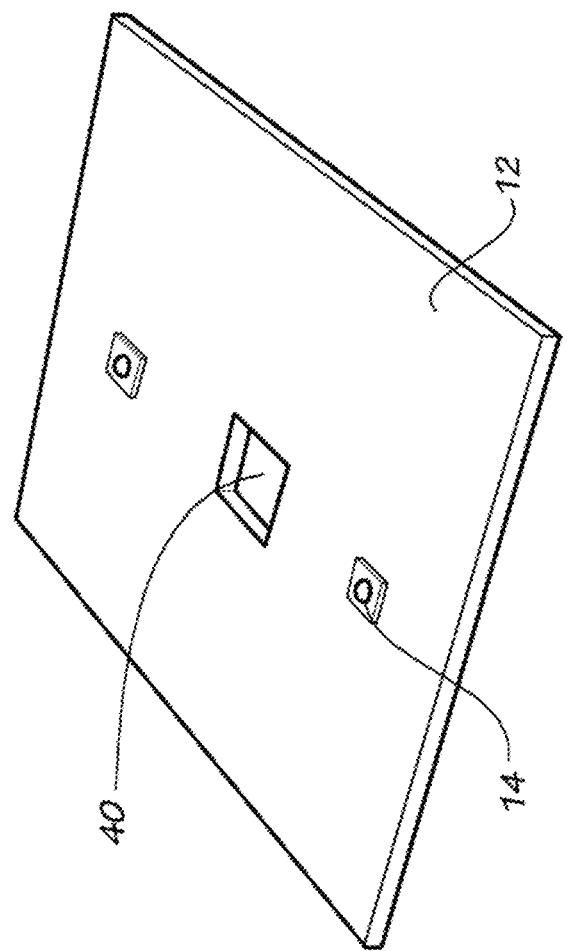
FIG. 7 is top perspective view of an embodiment of a PCB.

In some embodiments, openings or apertures 40 extend either partially or entirely through the PCB 12 (see FIG. 7) such that the optic 10 (more specifically the outer optic 18) partially or entirely fills those openings or apertures 40 to create a strong mechanical interlock between the optic 10 and the PCB 12. See FIG. 8. Any number of openings or apertures 40 may be provided on the PCB 12 in any location. Moreover, the outer optic 18 material (such as certain types of silicone) may have thermally transmissive properties such that the outer optic 18 conducts heat generated on the PCB 12 to an underlying substrate (not shown).

Figure 8:
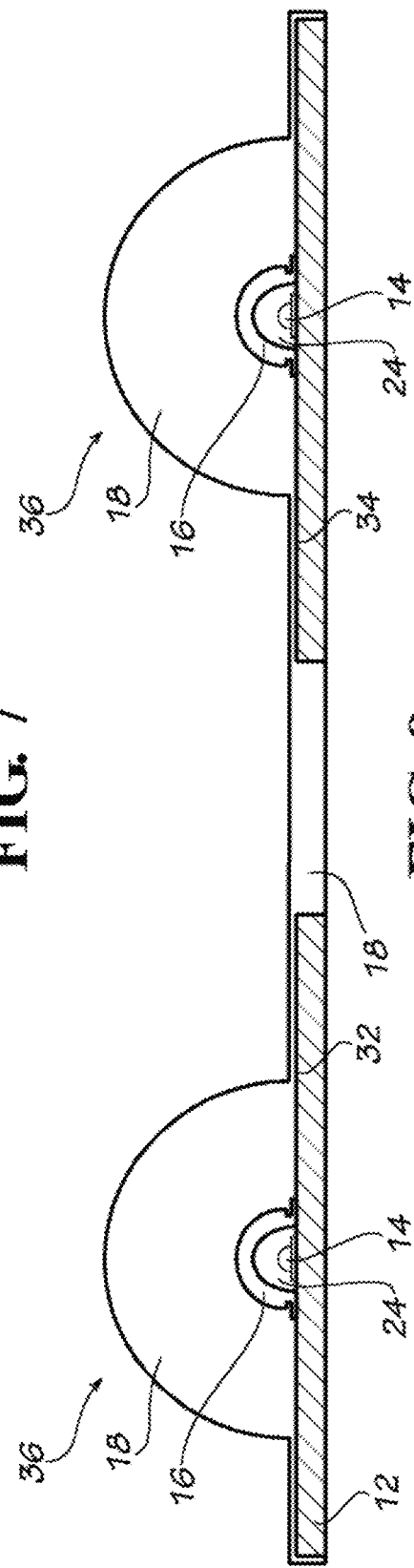
FIG. 8 is a cross-sectional view of another embodiment of an optic positioned on the PCB of FIG. 7.
Figure 11:
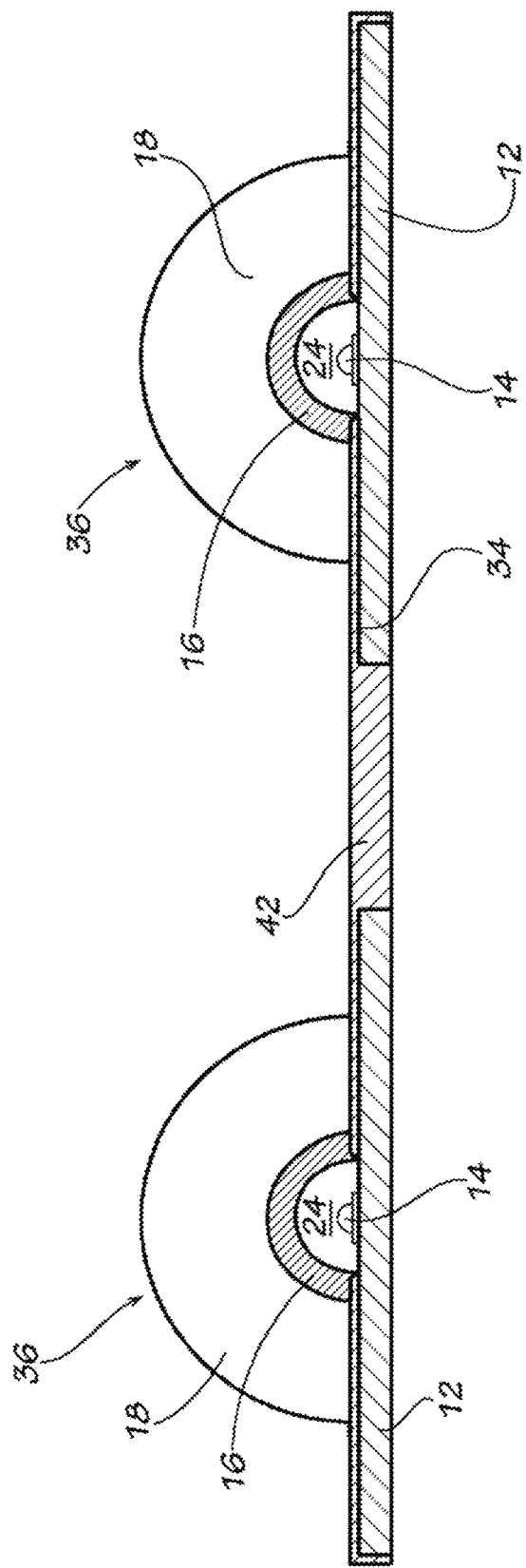
FIG. 11 is a cross-sectional view of yet another embodiment of an optic as well as a reflective surface coating positioned on the PCB of FIG. 7.

In another embodiment, a surface coating 42 of a highly reflective material (which in some embodiments is at least 90-100% reflective and in some embodiments is at least 98-100% reflective) is over-molded onto the upper surface 34 of the PCB 12 so as to conform to the upper surface 34 of the PCB 34. See FIGS. 9 and 10. In some embodiments, the highly reflective material is a silicone material. The surface coating 42 may cover any portion of the PCB upper surface 34. In some embodiments, the surface coating 42 is provided on the PCB 12 adjacent the LEDs 14, as shown in FIG. 10. The surface coating 42 may have angled sidewalls 44 adjacent the LEDs 14. An inner optic 16 may be positioned over the LED 14 (as described above) and then an outer optic 18 molded over the inner optic 16 (as described above) and optionally over a portion or all of the surface coating 42. The materials of the inner/outer optics 16, 18 may be the same or different, as described above. The angled sidewalls 44 of the reflective surface coating 42 help capture and reflect/redirect light emitted from an LED 14 approximately 90° off nadir back toward the inner optic 16, where it can be processed further by the inner optic 16 and outer optic 18. In embodiments where openings or apertures 40 are provided in the PCB 12, the reflective surface coating 42 (as opposed to the outer optic 18 as shown in FIG. 8) may fill such openings, as shown in FIG. 11.

In other embodiments, an outer optic 18 is not molded onto an inner optic 16 and the PCB 12. Rather, the entire optic 10 is pre-molded and then adhered to the PCB 12, such as with silicone or other adhesives.

Various types of silicone materials having the properties described herein are available from Dow Corning ("Dow"). For example, Dow's MS-1002 moldable silicone may be useful in certain applications. Moreover, Dow's moldable white reflector material may also be suitable, such as for use as surface coating 42. However, other sources for moldable silicone materials are known by those skilled in the art.

The foregoing is provided for purposes of illustrating, explaining, and describing embodiments of the present invention. Further modifications and adaptations to these embodiments will be apparent to those skilled in the art and may be made without departing from the scope or spirit of the invention. Different arrangements of the components depicted in the drawings or described above, as well as components and steps not shown or described are possible. Similarly, some features and subcombinations are useful and may be employed without reference to other features and subcombinations. Embodiments of the invention have been described for illustrative and not restrictive purposes, and alternative embodiments will become apparent to readers of this patent. Accordingly, the present invention is not limited to the embodiments described above or depicted in the drawings, and various embodiments and modifications can be made without departing from the scope of the invention.

We claim:

1. An optical assembly comprising:
   a. a circuit board having an upper surface on which at least one light source is positioned;
   b. a first optic formed of a silicone body defining an inner surface and an outer surface of the first optic, wherein the first optic comprises first optical properties and wherein:
      i. the first optic is positioned on the upper surface of the circuit board so as to entirely surround and encapsulate the at least one light source such that an air gap is formed between the at least one light source and the inner surface of the first optic; and
      ii. the outer surface of the first optic is smooth about substantially an entirety of the outer surface of the first optic; and
   c. a second optic formed of a homogenous silicone body defining an inner surface and an outer surface of the second optic, wherein the second optic comprises second optical properties and wherein at least a portion of the inner surface of the second optic is contiguous with the entirety of the outer surface of the first optic so as to entirely encapsulate the first optic.

2. The optical assembly of claim 1, wherein an interlocking feature is provided along the outer surface of the first optic and wherein the second optic engages the interlocking feature to mechanically interlock the first and second optics.

3. The optical assembly of claim 2, wherein the interlocking feature comprises a groove.

4. The optical assembly of claim 1, wherein the second optic is molded over the first optic.

5. The optical assembly of claim 1, wherein the silicone body of the first optic is formed of a silicone material identical to a silicone material that forms the homogenous silicone body of the second optic.

6. The optical assembly of claim 1, wherein the first optical properties are substantially identical to the second optical properties.

7. The optical assembly of claim 1, wherein an interface is formed between the outer surface of the first optic and the inner surface of the second optic and wherein the interface is substantially undetectable.

8. The optical assembly of claim 1, wherein the silicone body of the first optic is formed of a silicone material different from a silicone material that forms the homogenous silicone body of the second optic.

9. The optical assembly of claim 1, wherein the first optical properties are substantially different than the second optical properties.

10. The optical assembly of claim 1, wherein an interface is formed between the outer surface of the first optic and the inner surface of the second optic and wherein the interface is detectable.

11. The optical assembly of claim 1, wherein the circuit board further comprises at least one aperture that extends at least partially through the circuit board and wherein the second optic extends at least partially within the aperture.

12. The optical assembly of claim 1, wherein the circuit board further comprises an electronic component positioned on the upper surface of the circuit board and wherein at least another portion of the inner surface of the second optic conforms to the shape of the electronic component so as to seal and protect the electronic component on the circuit board.

13. The optical assembly of claim 1, wherein the circuit board further comprises a reflective surface coating provided on the upper surface of the circuit board and wherein at least another portion of the inner surface of the second optic covers at least a portion of an upper surface of the reflective surface coating.

14. The optical assembly of claim 13, wherein the reflective surface coating comprises silicone.

15. The optical assembly of claim 13, wherein the reflective surface coating is adapted to direct light emitted by the at least one light source toward at least one of the first optic or the second optic.

16. The optical assembly of claim 1, wherein the at least one light source comprises a plurality of light sources and wherein the first optic entirely surrounds and encapsulates the plurality of light sources.

17. The optical assembly of claim 1, wherein the second optic covers the entire upper surface of the circuit board.

18. The optical assembly of claim 1, wherein the optical assembly further comprises a third optic having an inner surface, an outer surface, and third optical properties, wherein at least a portion of the inner surface of the third optic is contiguous with at least a portion of the outer surface of the second optic.

19. The optical assembly of claim 18, wherein the inner surface of the third optic is contiguous with the entirety of the outer surface of the second optic so as to entirely encapsulate the second optic.

20. The optical assembly of claim 18, wherein the third optical properties are different than at least one of the first optical properties or the second optical properties.

* * * * *